United States Patent
Ju

(10) Patent No.: US 6,465,852 B1
(45) Date of Patent: Oct. 15, 2002

(54) SILICON WAFER INCLUDING BOTH BULK AND SOI REGIONS AND METHOD FOR FORMING SAME ON A BULK SILICON WAFER

(75) Inventor: Dong-Hyuk Ju, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 5 days.

(21) Appl. No.: 09/633,960

(22) Filed: Aug. 8, 2000

Related U.S. Application Data

(63) Continuation-in-part of application No. 09/420,972, filed on Oct. 20, 1999, now Pat. No. 6,229,187.

(51) Int. Cl.⁷ .............................................. H01L 29/72
(52) U.S. Cl. ...................... 257/396; 257/397; 257/401; 257/513; 257/520; 257/901
(58) Field of Search ................................ 257/396, 397, 257/401, 513, 520, 901

(56) References Cited

U.S. PATENT DOCUMENTS

| | | | |
|---|---|---|---|
| 4,571,609 A | 2/1986 | Hatano | |
| 4,682,407 A | 7/1987 | Wilson et al. | |
| 4,683,637 A | 8/1987 | Varker et al. | |
| 4,888,300 A | 12/1989 | Burton | |
| 4,989,057 A | * 1/1991 | Lu | ............................... 257/396 |
| 5,097,312 A | 3/1992 | Bayraktaroglu | |
| 5,262,346 A | 11/1993 | Bindal et al. | |
| 5,324,671 A | 6/1994 | Bayraktaroglu | |
| 5,391,503 A | 2/1995 | Miwa et al. | |
| 5,401,998 A | 3/1995 | Chiu et al. | |
| 5,466,630 A | 11/1995 | Lur | |
| 5,489,792 A | 2/1996 | Hu et al. | |
| 5,494,837 A | 2/1996 | Subramanian et al. | |
| 5,543,338 A | 8/1996 | Shimoji | |
| 5,618,345 A | 4/1997 | Saitoh et al. | |
| 5,620,912 A | 4/1997 | Hwang et al. | |
| 5,674,760 A | 10/1997 | Hong | |
| 5,683,932 A | 11/1997 | Bashir et al. | |
| 5,702,989 A | 12/1997 | Wang et al. | |
| 5,801,397 A | 9/1998 | Cunningham | |
| 5,804,856 A | 9/1998 | Ju | |
| 5,811,855 A | 9/1998 | Tyson et al. | |
| 5,825,696 A | 10/1998 | Hidaka et al. | |
| 5,846,857 A | 12/1998 | Ju | |
| 5,877,046 A | 3/1999 | Yu et al. | |
| 5,879,975 A | 3/1999 | Karlsson et al. | |
| 5,894,152 A | 4/1999 | Jaso et al. | |
| 5,907,768 A | 5/1999 | Malta et al. | |
| 5,963,789 A | 10/1999 | Tsuchiaki | |
| 5,972,758 A | 10/1999 | Liang | |
| 5,976,945 A | 11/1999 | Chi et al. | |
| 5,977,579 A | 11/1999 | Noble | |
| 6,004,864 A | 12/1999 | Huang et al. | |
| 6,008,104 A | 12/1999 | Schrems | |
| 6,066,527 A | 5/2000 | Kudelka et al. | |
| 6,080,603 A | * 6/2000 | Distefano et al. | ............. 257/396 |

FOREIGN PATENT DOCUMENTS

EP     0 480 373 A2     10/1991

OTHER PUBLICATIONS

S. Wolf and R.N. Tauber, Silicon Processing for the VLSI Era, vol. 1, p. 531.

* cited by examiner

*Primary Examiner*—Edward Wojciechowicz
(74) *Attorney, Agent, or Firm*—Renner, Otto, Boisselle & Sklar, LLP

(57) ABSTRACT

A silicon substrate comprises a silicon-on-insulator (SOI) portion which includes an insulating silicon dioxide layer beneath a device layer. SOI circuit structures, including SOI field effect transistors, are formed in the device layer. The substrate also comprises a bulk portion. Bulk semiconductor circuit structures are formed in wells in the bulk portion. The bulk circuit structures may be coupled to the SOI circuit structures.

20 Claims, 3 Drawing Sheets

SILICON WAFER INCLUDING BOTH BULK AND SOI REGIONS AND METHOD FOR FORMING SAME ON A BULK SILICON WAFER

CROSS REFERENCE TO RELATED APPLICATION

This application is a continuation-in-part commonly assigned, U.S. patent application Ser. No. 09/420,972, filing date Oct. 20, 1999 now U.S. Pat. No. 6,229,187, entitled Field Effect Transistor With Non-Floating Body And method For Forming Same On A Bulk Silicon Wafer, the entire disclosure of which is incorporated herein by reference.

TECHNICAL FIELD

The present invention relates generally to silicon-on-insulator (SOI) structures, and more specifically to SOI substrate structures advantageous in the fabrication of SOI transistors and bulk structures on the same substrate.

BACKGROUND OF THE INVENTION

Conventional or bulk semiconductor devices are formed in semiconductive material by implanting a well of either P-type or N-type conductivity silicon in a silicon substrate wafer of the opposite conductivity. Gates and source/drain diffusions are then manufactured using commonly known processes. These form devices known as metal-oxide-semiconductor (MOS) field effect transistors (FETs). When a given chip uses both P-type and N-type, it is known as a complimentary metal oxide semiconductor (CMOS). Each of these transistors must be electrically isolated from the others in order to avoid shorting the circuits. A relatively large amount of surface area is needed for the electrical isolation of the various transistors. This is undesirable for the current industry goals for size reduction. Additionally, junction capacitance between the source/drain and the bulk substrate and "off" state leakage from the drain to the source both increase power consumption. Junction capacitance also slows the speed at which a device using such transistors can operate. These problems result in difficulties in reducing the size, power consumption, and voltage of CMOS technology devices.

In order to deal with the junction capacitance and "off state" leakage problem as well as obtain reduced size, silicon-on-insulator technology (SOI) has been gaining popularity. A SOI wafer is formed from a bulk silicon wafer by using conventional oxygen implantation techniques to create a buried oxide layer at a predetermined depth below the surface. The implanted oxygen oxidizes the silicon into insulating silicon dioxide in a guassian distribution pattern centered at the predetermined depth to form the buried oxide layer.

One problem with forming field effect transistors on an SOI wafer is the floating body effect. The floating body effect occurs because the buried oxide layer isolates the channel, or body, of the transistor from the fixed potential silicon substrate and therefore the body takes on charge based on recent operation of the transistor. The floating body effect causes the current-to-voltage curve for the transistor to distort or kink, which in turn causes the threshold voltage for operating the transistor to fluctuate. This problem is particularly apparent for passgate devices such as those used in dynamic random access memory (DRAM) wherein it is critical that the threshold voltage remain fixed such that the transistor remains in the "Off" position to prevent charge leakage from the storage capacitor.

Another problem associated with SOI technology is heat build up. The insulating silicon dioxide in the buried oxide layer is a poor heat conductor and prevents effective heat dissipation into bulk silicon below the buried oxide layer.

A third problem associated with SOI technology is that SOI structures are more susceptible to electrostatic damage (ESD) than bulk structures because the insulating layer inhibits use of the bulk substrate as a conductor for ESD current spikes.

Accordingly, there is a strong need in the art for a semiconductor circuit structure, and a method for forming such structure, that includes the low junction capacitance and low "off" state leakage characteristics of the SOI FET based circuits but does not suffer the disadvantages of a floating body potential, heat build up, and ESD fragility associated with known SOI circuits.

SUMMARY OF THE INVENTION

A first aspect of the present invention is to provide a semiconductor circuit comprising: a) a substrate having a silicon-on-insulator (SOI) region including an insulating layer of buried oxide separating a thin semiconductor device layer from a bulk silicon layer and a bulk region; and b) a logic circuit comprising an SOI circuit portion formed from SOI devices in the SOI region and a bulk circuit portion formed from bulk semiconductor structures formed in the bulk region. Further, a metal interconnect layer may operatively couple the SOI circuit portion to the bulk circuit portion.

The SOI circuit portion may include SOI FETs and the bulk circuit portion may include bulk FETs, the SOI FETs having a lower capacitance and faster operating speed than the bulk FETs. Additionally, the bulk FETs may have a larger current flow and generate more heat than the SOI FETs. The bulk circuit portion may include input/output buffer circuits and electrostatic damage (ESD) protection circuits. The ESD protection circuits may couple a plurality of controlled collapse chip connection terminals (C4 terminals) to the input/output buffer circuits. The C4 terminals may couple and bond the circuit to an IC package or a printed circuit board. A second aspect of the present invention is to provide a method of forming a silicon logic circuit comprising the steps of: a) masking a portion of the surface of a silicon substrate to form a masked region corresponding to a bulk circuit portion and an unmasked region corresponding to an SOI circuit portion; b) performing an oxygen implant to oxidize the silicon substrate to form an insulating layer of silicon dioxide beneath the unmasked region; c) forming SOI circuit structures in the SOI circuit portion and bulk circuit structures in the bulk circuit portion. Further, the method may include forming a metal interconnect layer coupling the SOI circuit structures to the bulk circuit structures.

The step of forming SOI circuit structures may include forming SOI FETs and the step of forming bulk circuit structures may include forming bulk FETs. Further, the step of forming bulk circuit structures may include forming input/output buffer circuits and ESD protection circuits. Further yet, the method may further include forming a plurality of C4 connection terminals, the ESD protection circuits coupling the connection terminals to the input/output buffer circuits.

DESCRIPTION OF THE PREFERRED EMBODIMENTS

Figure 1:
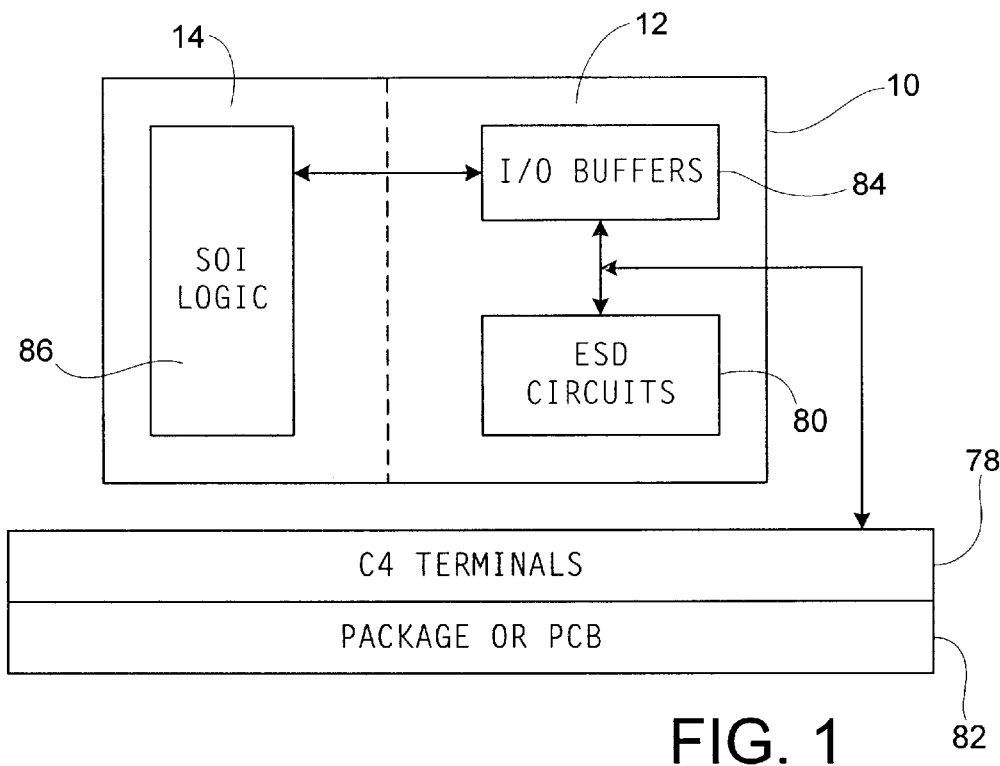
FIG. 1 is a block diagram showing the circuit structure of a silicon circuit in accordance with one embodiment of this invention.

The present invention will now be described in detail with reference to the drawings. In the drawings, like reference numerals are used to refer to like elements throughout.

Referring to FIG. 1, circuit 10 includes a bulk region 12 and a silicon-on-insulator (SOI) region 14. SOI region 14 includes SOI logic circuits 86 including a plurality of SOI field effect transistors (FETs). As discussed previously, SOI FETs have low capacitance and can operate at faster clock speeds making the SOI logic circuits advantageous for implementing high speed logic. Bulk region 12 includes bulk circuits such as input/output (I/O) buffer circuits 84 and electrostatic damage (ESD) protection circuits 80. Bulk field effect transistors can typically handle larger current flows without damage and can more quickly dissipate heat than SOI FETs. Therefore, bulk region 12 is advantageous for implementation of I/O buffer circuits 84 and ESD protection circuits 80.

The SOI logic circuits 86 are coupled to the I/O buffer circuits 84 which in turn are coupled to the ESD protection circuits 80. The ESD protection circuits 80 and the I/O buffer circuits 84 couple to controlled collapse chip connection (C4) terminals 78 for coupling and bonding circuit 10 to an IC package or a printed circuit board 82.

Figure 2:
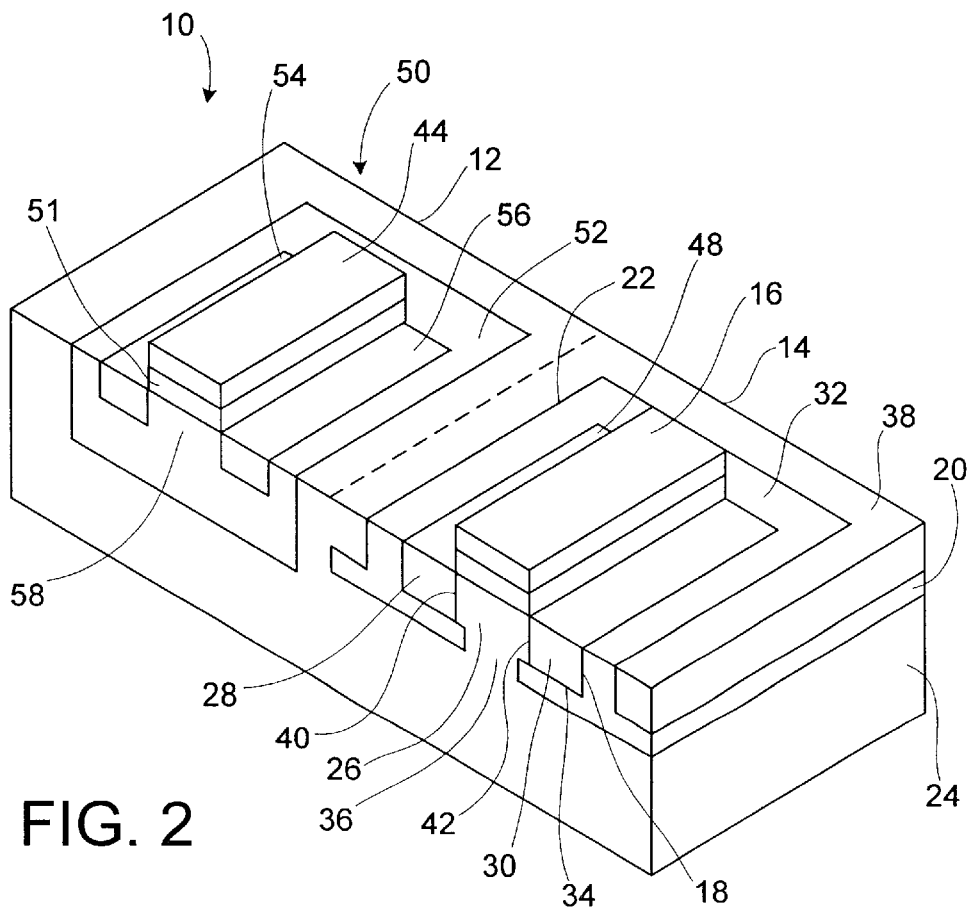
FIG. 2 is a perspective view, cut away, of a bulk field effect transistor (FET) and a silicon-on-insulator field effect transistor (SOI FET) formed on a silicon substrate in accordance with one embodiment of this invention.

Referring to FIG. 2, a schematic cross section of silicon substrate 24 of circuit 10 is shown. Substrate 24 includes the bulk region 12 and the silicon-on-insulator (SOI) region 14. An SOI FET 16 is shown in SOI region 14 and a bulk FET 50 is shown in bulk region 12.

SOI FET 16 includes a channel region 26, a source region 28, and a drain region 30. In the exemplary embodiment of this invention, the channel region 26 is preferably P-conductivity silicon while the source region 28 and the drain region 30 are each N-conductivity silicon to form two semiconductor junctions 40 and 42. However, in accordance with known silicon technology, the channel region 26 may be N-conductivity silicon while each of the source region 28 and the drain region 30 are P-conductivity silicon. An active region 48 is isolated by an insulating trench 32 which extends from the surface 38 to a buried oxide layer 20. The insulating trench 32 has side walls 18 which define the perimeter 22 of the active region 48 of SOI FET 16 and insulates the active region 48 from other structures formed in the silicon substrate 24. The perforated buried oxide layer 20 forms the bottom surface 34 of the active region 48 and includes a perforated region 36 wherein semi-conductive silicon electrically couples the channel region 26 of the active region 48 to the bulk silicon substrate 24.

It should be appreciated that because the semi-conductive silicon in the perforated region 36 electrically couples the channel region 26 to the bulk silicon substrate 24, the channel region 26 potential will always remain at the potential of the silicon substrate 24 and can not accumulate a charge, or float, based on historical operation of the SOI FET 16. It should also be appreciated that because the cross sectional area of the perforated region 36 is significantly smaller than the cross sectional area of the active region 48, there is no semiconductor junction, or minimal sized semiconductor junction, between either the source region 28 or the drain region 30 and the silicon substrate 24 thereby reducing junction capacitance.

The bulk FET 50 is formed in a well 52 in bulk region 12 of the substrate 24. Well 52 is preferably a P-conductivity silicon well formed in the substrate 24. Each of an N-conductivity source region 54 and drain region 56 are formed in well 52 and separated by a channel region 58. A gate oxide 51 and a polysilicon gate 44 above channel region 58 control operation of bulk FET 50.

Figure 3A:
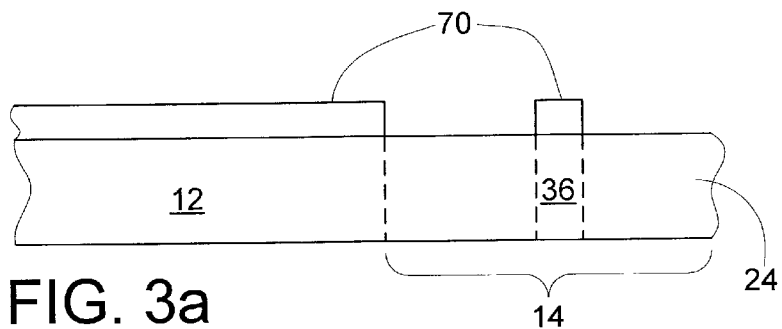
FIG. 3a is a cross sectional view of a first step in the fabrication of a silicon wafer in accordance with one embodiment of this invention.
Figure 3B:
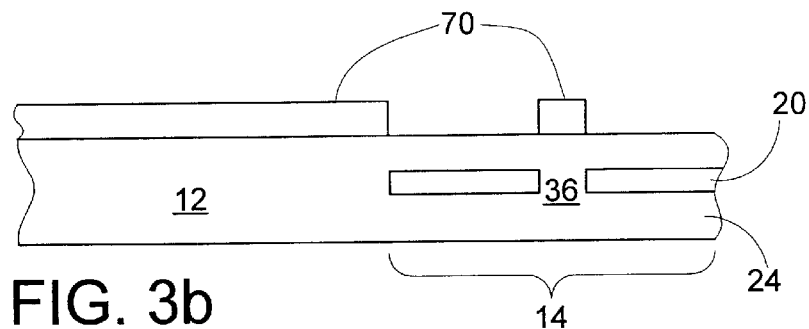
FIG. 3b is a cross sectional view of a second step in the fabrication of a silicon wafer in accordance with one embodiment of this invention.
Figure 3C:
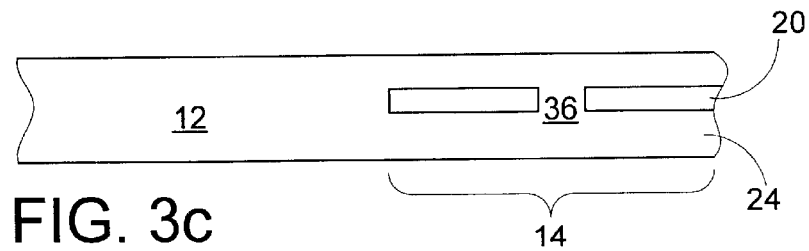
FIG. 3c is a cross sectional view of a third step in the fabrication of a silicon wafer in accordance with one embodiment of this invention.

Referring to FIGS. 3a–3c, steps in fabrication of wafer with a silicon-on-insulator region 14 and a bulk region 12 are shown. Referring specifically to FIG. 3a, a photoresist mask 70 is formed on the surface of the substrate 24 above the bulk region 12 and above the perforation region 36 to define the bulk region 12 and the perforated region 36.

Typically a photoresist mask can be formed by applying a UV sensitive photoresist layer to the top surface of the silicon substrate 24. Conventional photolithography techniques are used to pattern the mask regions 70 of the photoresist and develop the photoresist. In a typical photolithography process, a UV light source and reticle provide collimated light used to expose and pattern the photoresist layer in order to form the mask. Assuming that a positive photoresist is used, a developer solution dissolves the photoresist in the UV light exposed area developer washes away the photoresist in such exposed areas.

Referring to FIG. 3b, conventional Separation by Implantation of Oxygen (SIMOX) techniques are used to form the buried oxide layer 20 in the silicon substrate 24 in the SOI region 14. An ion beam is used to implant a high dose of oxygen, greater than 10 E16 atoms per square centimeter, into the silicon substrate. The dose and beam energy parameters of the SIMOX process are controlled to control a resultant gaussian concentration of oxygen implanted in the wafer as a function of depth below the surface. Typically the dose and beam energy are selected such that the highest concentration of implanted oxygen (e.g. the peak of the gaussian distribution) is at the desired depth of the buried oxide layer 20 and lower concentrations exist both above and below the high concentration layer. A heat treatment then bonds the implanted oxygen with the silicon to form silicon dioxide (e.g. the high concentration layer becomes the buried oxide layer). Because the photoresist mask 70 blocks the ION beam and thus blocks the implantation of oxygen in the area of the substrate covered by the photoresist mask 70 the masked portion becomes the bulk region 12 and the perforated region 36 after the buried oxide layer is formed in the unmasked region.

It should be appreciated that creating the buried oxide layer does not include removing silicon and replacing it with silicon dioxide. Instead, a portion of the silicon substrate is oxidized (e.g. chemically altered by the oxygen implant) to become the silicon dioxide in the buried oxide layer 20. Therefore, bulk region 12 and the perforated region 36 are uniform regions of un-oxidized silicon.

Referring to FIG. 3c, the photoresist mask 70 is removed resulting in the substrate 24 with a bulk region 12 and an SOI region 14 with perforation 36.

Figure 4A:
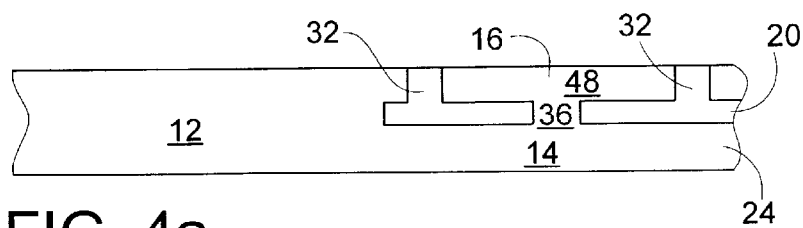
FIG. 4a is a cross sectional view of a first step in the fabrication of circuit structures in a wafer in accordance with one embodiment of this invention.
Figure 4B:
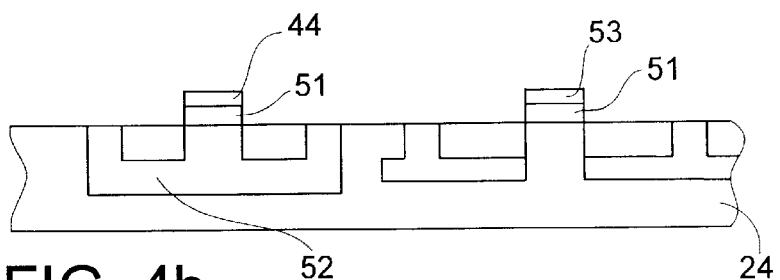
FIG. 4b is a cross sectional view of a second step in the fabrication of circuit structures in a wafer in accordance with one embodiment of this invention.
Figure 4C:
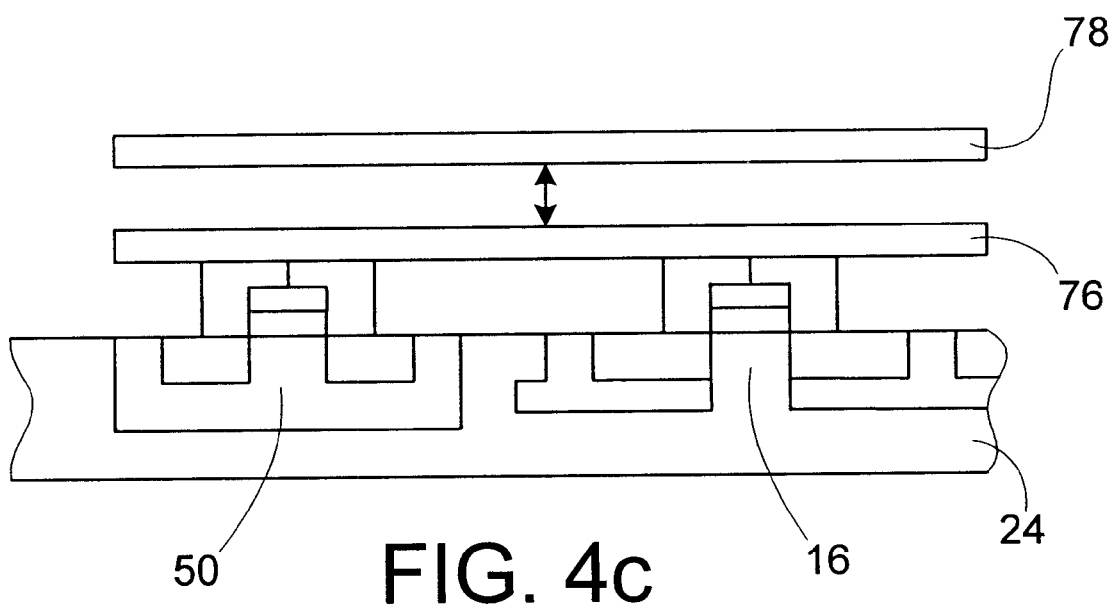
FIG. 4c is a cross sectional view of a third step in the fabrication of circuit structures in a wafer in accordance with one embodiment of this invention.

Referring to FIGS. 4a–4c, steps in fabricating FET structures in a wafer are shown. Referring specifically to FIG. 4a, conventional SOI fabrication processes are used to form insulating trenches 32 for isolating SOI FET 16 from other structures (not shown) formed in SOI region 14. An exemplary process for forming an insulating trench includes forming a thin layer of oxide, approximately 150–200 Angstroms thick, on the top surface of the silicon substrate and forming a silicon nitride mask thereon. The mask covers and protects the substrate in the area where the active region 48 of SOI FET 16 is to be formed while leaving the area where the insulating trench 32 is to be formed exposed.

Thereafter, the unmasked portions of the silicon substrate 24 (e.g. the portions where the silicon nitride mask has been etched away) are etched away to form an open trench extending at least past the upper surface of the buried oxide layer 20. The etching process for the silicon substrate is typically an anisotropic dry etch using hydrogen bromide (HBr) which has selectivity characteristics such that it etches the silicon substrate 24 but not the silicon nitride mask.

The open trench is filled by depositing silicon dioxide (SiO2), formed by a chemical reaction involving SiH4 or TEOS, to form insulating trench 32. After filling the open trench the surface of the wafer is polished using a chemical mechanical polish to remove any excess silicon dioxide layer and the remaining silicon nitride mask.

Referring to FIG. 4b, conventional techniques are used to form well 52 in substrate 24. Further, a gate oxide layer 51, and polysilicon gates 53 and 44 are formed on the top surface of the substrate 24 to define the channel regions 26 and 58 in a conventional CMOS self aligned gate, source, and drain process.

The gate oxide layer 51 is typically grown on the surface of the substrate 24 using a thermal oxidation process and a polysilicon layer is deposited on top of the gate oxide layer 51 using a low pressure chemical vapor deposition (LPCVD) process. The polysilicon layer is then patterned and etched using the photolithography method discussed earlier to create polysilicon gates 52 and 44.

Portions of the silicon on opposing sides of the channel regions that are not masked by the gates 52 and 44 are doped into N-type silicon. Doping is typically performed using Ion implantation techniques. Ions of an N-type dopant 54, such as arsenic are accelerated to a high velocity in an electric field and impinge on the target wafer. Because the ions cannot penetrate the poly-silicon gate, the polysilicon gate effectively operates as a mask which results in doping only the exposed source region and drain region.

Referring to FIG. 4c, SOI FET 16 and bulk FET 50 are electrically interconnected by metal layers 76 formed above the substrate 24. Thereafter, C4 techniques are used to form C4 terminals 78 above the metal layers for coupling and bonding the circuit 10 to an IC package or a printed circuit board.

It should be appreciated that the foregoing processes of fabricating a semiconductor circuit including both SOI regions and bulk regions results in a unique circuit structure that eliminates the floating body effect found in known SOI FET structures and provides for circuits that are optimally implements in SOI to be implemented in the SOI regions and provide for circuits that are optimally implemented in bulk silicon to be implemented in the bulk region.

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A semiconductor device comprising:
   a) a substrate having
      1) a silicon-on-insulator region including an insulating layer of buried oxide at least partially separating a thin semiconductor device layer at a top surface of the substrate from a bulk silicon layer, and
      2) a bulk region, wherein the bulk silicon layer extends to the top surface of the substrate; and
   b) a logic circuit comprising an silicon-on-insulator circuit portion formed from silicon-on-insulator devices in the silicon-on-insulator region and a bulk circuit portion formed from bulk semiconductor structures formed in the bulk region;
   wherein the silicon-on-insulator portion is operatively coupled to the bulk circuit portion.

2. The device of claim 1, further including a metal interconnect layer operatively coupling the silicon-on-insulator circuit portion to the bulk circuit portion.

3. The device of claim 2, wherein the silicon-on-insulator circuit portion includes silicon-on-insulator field effect transistors and the bulk circuit portion includes bulk field effect transistors, the silicon-on-insulator field effect transistors having a lower capacitance and faster operating speed than the bulk field effect transistors.

4. The device of claim 3, wherein the bulk field effect transistors have a larger current flow and generate more heat than the silicon-on-insulator field effect transistors.

5. The device of claim 4, wherein the bulk circuit portion includes input/output buffer circuits.

6. The device of claim 5, wherein the bulk circuit portion includes electrostatic damage protection circuits.

7. The device of claim 6, further including a plurality of connection terminals coupled to at least one of the electrostatic damage protection circuits and the input/output buffer circuits.

8. The device of claim 7, wherein the connection terminals include a plurality of controlled collapse chip connection terminals for coupling the logic circuit to at least one of a chip package and a printed circuit board.

9. A method of forming a silicon logic circuit comprising the steps of:
   a) masking a portion of a top surface of a silicon substrate to form a masked region corresponding to a bulk circuit portion in which a bulk silicon layer of the substrate extends to the top surface of the substrate, and an unmasked region corresponding to at least part of a silicon-on-insulator circuit portion;
   b) performing an oxygen implant to oxidize the silicon substrate to form an insulating layer of silicon dioxide beneath the unmasked region; and
   c) forming silicon-on-insulator circuit structures in the silicon-on-insulator circuit portion and bulk circuit structures in the bulk circuit portion.

10. The method of claim 9, further including forming a metal interconnect layer coupling the silicon-on-insulator circuit structures to the bulk circuit structures.

11. The method of claim 10, wherein the step of forming silicon-on-insulator circuit structures includes forming silicon-on-insulator field effect transistors and the step of forming bulk circuit structures includes forming bulk field effect transistors.

12. The method of claim 11, wherein the step of forming bulk circuit structures includes forming input/output buffer circuits.

13. The method of claim 12, wherein the step of forming bulk circuit structures includes forming electrostatic damage protection circuits.

14. The method of claim 13, further including forming a plurality of connection terminals coupled to at least one of the electrostatic damage protection circuits and the connection terminals to the input/output buffer circuits.

15. The method of claim 14, wherein the connection terminals include a plurality of controlled collapse chip connection terminals for coupling the logic circuit to at least one of a chip package and a printed circuit board.

16. The device of claim 3, wherein at least some of the silicon-on-insulator field effect transistors are operatively coupled to the bulk silicon layer through respective perforations in the insulating layer.

17. The device of claim 3, wherein at least some of the bulk field effect transistors include respective bulk wells, wherein parts of the bulk wells are further than the insulating layer from the top surface.

18. The device of claim 3, wherein at least some of the silicon-on-insulator field effect transistors are surrounded by respective insulating trenches.

19. The method of claim 9, wherein the masking includes masking some of the silicon-on-insulator circuit portion with additional mask elements, and wherein the performing the oxygen implant includes forming the insulating layers with perforations corresponding to the additional mask elements.

20. The method of claim 19, wherein the forming the silicon-on-insulator circuit structures includes forming at least some of the silicon-on-insulator circuit structures operatively coupled to the bulk silicon layer via the perforations.

* * * * *